United States Patent [19]

Sekiba

[11] 4,143,395

[45] Mar. 6, 1979

[54] STUD-TYPE SEMICONDUCTOR DEVICE

[75] Inventor: Toshinobu Sekiba, Yokohama, Japan

[73] Assignee: Tokyo Shibaura Electric Co., Ltd., Kawasaki, Japan

[21] Appl. No.: 908,530

[22] Filed: May 22, 1978

Related U.S. Application Data

[63] Continuation of Ser. No. 732,969, Oct. 15, 1976, abandoned.

[51] Int. Cl.² .................. H01L 23/42; H01L 23/44; H01L 23/46
[52] U.S. Cl. .................................. 357/79; 357/74; 357/81; 357/68
[58] Field of Search .................. 357/68, 74, 81, 79

[56] References Cited

U.S. PATENT DOCUMENTS

| 2,922,935 | 1/1960 | Dolder | 357/81 |
|---|---|---|---|
| 3,160,800 | 12/1964 | Smart | 357/81 |
| 3,242,390 | 3/1966 | Scharli | 357/79 |
| 3,294,895 | 12/1966 | Reintgen | 357/79 |
| 3,337,781 | 8/1967 | Ferree | 357/81 |
| 3,433,885 | 3/1969 | Choffart | 357/74 |

Primary Examiner—Andrew J. James
Attorney, Agent, or Firm—Finnegan, Henderson, Farabow & Garrett

[57] ABSTRACT

A semiconductor device includes a semiconductor element having at least three semiconductor areas corresponding to first, second and third semiconductor areas, a first electrode connecting means comprising a cylindrical stud electrically connected to the first semiconductor area of the semiconductor element, and second and third electrode connecting means connected to the closed end of a housing in a position deviated from the axis of the cylindrical stud. The second electrode connecting means has a cylindrical section situated concentric with the cylindrical stud and including a free end, and includes a through hole extending from a side surface thereof toward the free end while passing through the center of the cylindrical section. The third electrode connecting means comprising a flexible lead and it is received in the through hole of the second electrode connecting means. The second electrode connecting means is electrically connected to the second semiconductor area of the semiconductor element through a lead and the third electrode connecting means is electrically connected to the third semiconductor area of the semiconductor element through a lead.

17 Claims, 4 Drawing Figures

STUD-TYPE SEMICONDUCTOR DEVICE

This is a continuation pf application Ser. No. 732,969, filed 10/15/76 and now abandoned.

BACKGROUND OF THE INVENTION

I. Field of the Invention

This invention relates to a semiconductor device and in particular a stud type semiconductor device including a semiconductor element having at least three semiconductor areas corresponding to first, second and third semiconductor areas.

By a "semiconductor element" as specifically recited in the specification and claims is meant a semiconductor element having semiconductor areas formed therein, and a "semiconductor device" herein defined is intended to mean one on which predetermined parts are mounted.

II. Description of the Prior Art

A semiconductor controlled rectifier (SCR) is known among stud type semiconductor devices including a semiconductor element having at least three semiconductor areas. The SCR comprises, for example, a silicon semiconductor element having anode, cathode and gate areas; a housing for surrounding the semiconductor element; a stud type anode electrode connecting means connected to the anode area of the semiconductor element; a cathode electrode connecting means mounted on the top of the housing; and a gate electrode connecting means.

The housing and stud, which usually have hollow and solid cylindrical shapes, respectively, are arranged concentrical with each other, i.e., in alignment with each other. The gate electrode connecting means and cathode electrode connecting means are connected to the top of the housing in a position deviated from the center axis of the stud i.e., eccentrical with the stud. The gate electrode connecting means comprises a flexible lead and the cathode electrode connecting means comprises a rigid electroconductive cylindrical body. The gate electrode connecting means is connected through a lead to the gate area of the semiconductor element and the cathode electrode connecting means is connected through a lead to the cathode area of the semiconductor element. The cathode electrode connecting means and stud have screw thread portion.

When the above-mentioned rectifying device is incorporated into a predetermined apparatus, the cathode electrode connecting means and gate electrode connecting means are attached to the corresponding terminals after the anode electrode connecting means are threadably mounted on a radiator. Since, however, the anode electrode connecting means are screw threaded over the radiator, it is difficult to locate the cathode connecting means and gate electrode connecting means relative to the anode electrode connecting means. That is, since the relative position of the cathode electrode connecting means and gate electrode connecting means is deviated from the position in which the anode electrode connecting means are threadably tightened, difficulty is encountered in connecting the cathode electrode connecting means and gate electrode connecting means to the respective terminals. Furthermore, the gate electrode connecting means is limply supported, thus impairing an outward appearance.

SUMMARY OF THE INVENTION

An object of this invention is to provide an improved semiconductor device including a semiconductor element having at least three semiconductor areas.

Another object of this invention is to provide an improved semiconductor device which is simple in structure and assures an easiness with which it is mounted to a predetermined position.

These and other objects which will be apparent from the following description are attained by a semiconductor device comprising:

a semiconductor element having at least three semiconductor areas corresponding to first, second and third semiconductor areas;

a first electrode connecting means comprising a solid cylindrical electroconductive stud having a first end and a second end electrically connected to said first semiconductor area;

a housing comprising a hollow body having a closed end and an open end connected to said first electrode connecting means and surrounding said semiconductor element;

a second electrode connecting means comprising a rigid electroconductive body extending outwardly of the housing and having a free end and a base end connected to the closed end of said housing in a position deviated from the axis of said first electrode connecting means, said rigid electroconductive body comprising a section including said base end and a cylindrical section including said free end and situate concentrical with said first electrode connecting means and having a through hole extending from the side surface thereof toward said free end while passing at least through the center axis of said cylindrical section;

a third electrode connecting means comprising a flexible electroconductive body extending outwardly of said housing and having a first free end and a second end connected to the closed end of said housing in a position deviated from the center axis of said first electrode connecting means, said flexible body electrically insulatingly passing through the through hole of said second electrode connecting means, the free end of said third electrode connecting means extending from the free end of said second electrode connecting means;

a first lead electrically connecting said second semiconductor area to said second electrode connecting means; and a second lead electrically connecting said third semiconductor area to said third electrode connecting means.

DETAILED DESCRIPTION OF THE PREFERRED EMBODIMENTS

This invention will be explained below by referring to the accompanying drawings.

Figure 1:
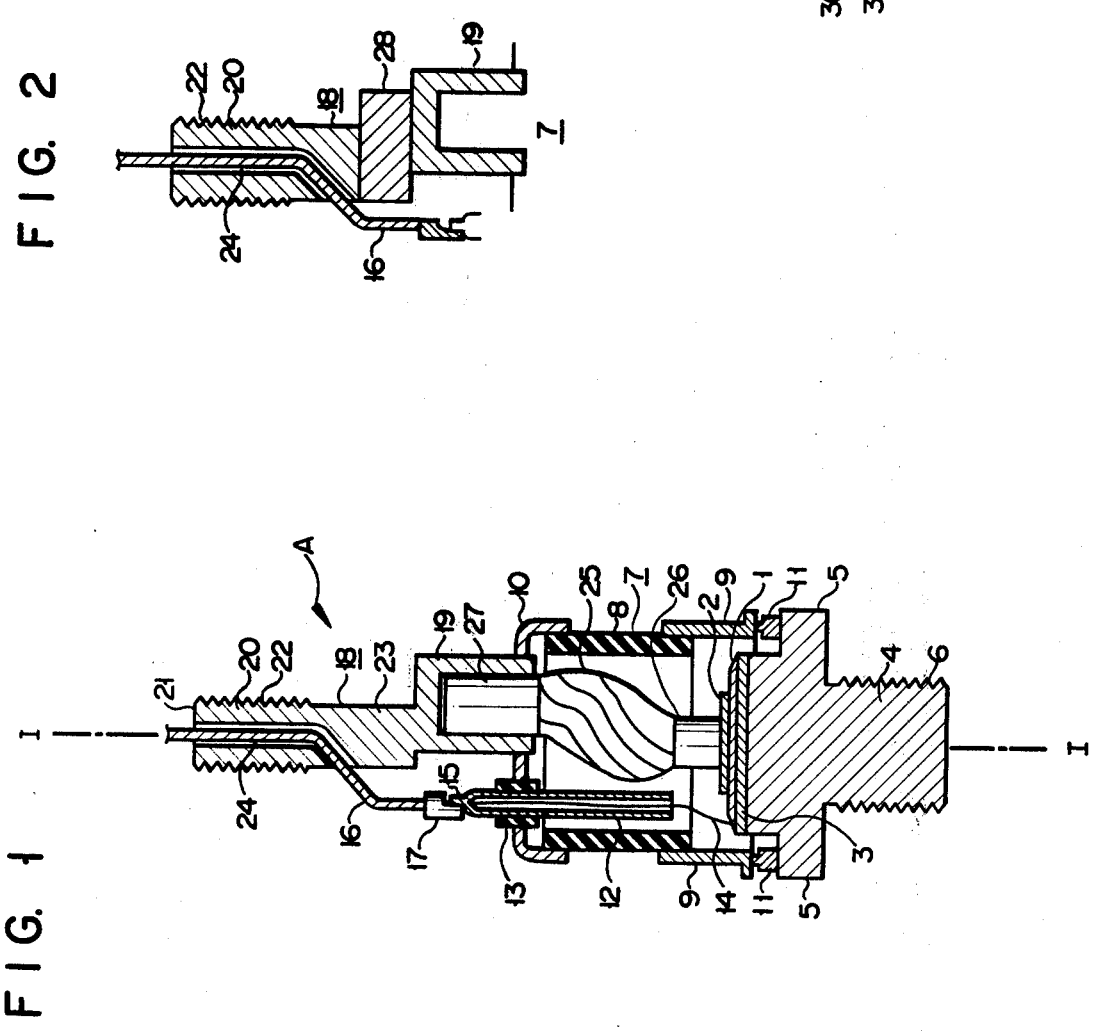
FIG. 1 is a cross-sectional view showing a semiconductor device according to one embodiment of this invention.

In FIG. 1 a semiconductor device A of this invention is a semiconductor controlled rectifying device for use, for example, in a turbine, etc. The semiconductor device A has, for example, a silicon semiconductor element 1 to the top and bottom surfaces of which protective members 2 and 3 usually made of molybdenum or tungsten are welded, respectively. The semiconductor device 1 has predetermined three semiconductor areas: an anode area, cathode area and a gate area (not shown).

To the bottom of the protective member 3 is silver-soldered an anode electrode connector 4 made of, for example, copper and consisting of a solid cylindrical stud equipped with a flange 5. The stud 4 has an externally threaded section 6 through which the rectifying device A is mounted on a radiator (not shown).

A housing 7 is disposed to surround the semiconductor element 1 and it has a hollow cylindrical body 8 made of an insulating material such as ceramics. The center axis of the cylindrical body 8 aligns with a center axis I—I of the cylindrical stud 4. A flange section 9 made of an iron-nickel alloy or an iron-nickel-cobalt alloy is soldered to the outer peripheral surface portion of the open end of the housing 7. The flange section 9 is supported on the flange 5 of the stud 4 through a weld ring 11 made of, for example, iron. A cap 10 usually made of an iron-nickel alloy or an iron-nickel-cobalt alloy is soldered to the cylindrical body 8 to cover the upper open end of the cylindrical body 8.

A gate tube 12 made of, for example, an iron-nickel-cobalt alloy extends through the cap 10 of the housing 7. The gate tube 12 is insulated by a ceramics tube 13 from the cap 10, and a lead-in wire 14 connected to the gate area of the semiconductor element 1 is passed through the gate tube 12. That end portion of the gate tube 12 which extends from the cap 10 is compressed together with the lead-in wire 14. A gate electrode connecting means comprising a flexible lead-in wire is welded through a welded portion 17 to the compressed end 15 of the gate tube 12. As shown in FIG. 1 the gate electrode connecting means 16 is deviated from the center axis of the stud 4.

A cathode electrode connecting means 18 made of copper is connected to the cap 10 of the housing 7 and extends outward from the housing 7. As will be seen from FIG. 1 the cathode electrode connecting means 18 extends through the cap 10 and has a hollow cylindrical section 19 welded or soldered to the cap 10. The center axis of the hollow cylindrical section 19 is not in alignment with the axis I—I of the stud 4. That is, the cathode electrode connecting means 18 is connected to the cap 10 in a manner to be deviated from the axis of the stud 4.

The cathode electrode connecting means 18 has a solid cylindrical section 20 including a free end 21 of the cathode electrode connecting means 18. The center axis of the cylindrical section 20 aligns with the center axis I—I of the stud 4. That is, the solid cylindrical section 20 of the cathode electrode connecting means 18 is concentrical with the stud 4. An external thread 22 is provided on the outer peripheral surface portion of the solid cylindrical section 20 so as to be threadably connected to a suitable terminal (not shown).

In FIG. 1 an intermediate section 23 extending from the hollow cylindrical section 19 to the solid cylindrical section 20 is substantially equal to the solid cylindrical section 20.

In the cathode electrode connecting means is provided a through hole 24 which extends from the side portion of the intermediate portion 23 through a vertical passage of the solid cylindrical section 20 toward the free end 21 of the cathode electrode connecting means. The gate electrode connecting means 16 is passed through the through hole 24 and extends from the free end 21 of the solid cylindrical section 20. In order to electrically insulate the gate electrode connecting means 16 from the cathode electrode connecting means 18 an electrically insulating material such as Teflon, silicon etc. are coated on the outer surface of the gate electrode connecting means 16 and/or on the inner surface of the through hole 24 and in the neighborhood of the open end of the through hole 24. The gate electrode connecting means 16 can also be electrically insulated from the cathode electrode connecting means by inserting an electrically insulating tube over the gate electrode connecting means 16. An inner conductor 25 consisting of a stranded copper wire is provided to electrically connect the cathode electrode connecting means 18 to the cathode area of the semiconductor element 1. The inner conductor has one end held with a copper tube 26 and the other end held with a copper tube 27. The inner conductor is caulked at both ends where the copper tubes are held. One end of the inner conductor 25 is silver-soldered to the protective member 2 of the semiconductor element 1 and the other end of the inner conductor 25 is silver-soldered to the interior of the hollow cylindrical section 19 of the cathode electrode connecting means 18.

Figure 2:
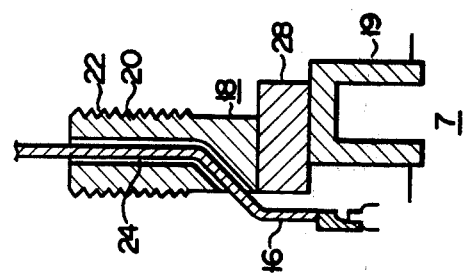
FIG. 2 is a cross-sectional view partly showing a semiconductor device according to another embodiment of this invention.

FIG. 2 shows another form of a cathode electrode connecting means in which an intermediate section extending from a cylindrical section 19 to a cylindrical section 20 consists of a separate solid cylindrical body 28 larger in diameter than the solid cylindrical section 20. The intermediate section 28 can be soldered or welded to the corresponding cylindrical sections 9 and 20 or can be threadably mounted on the corresponding cylindrical sections 19 and 20. The provision of such intermediate section 28 is particularly effective in the case where the axis of the cylindrical section 19 of the cathode electrode connecting means 18 is greatly deviated from the axis I—I of the stud 4. In this case, the cathode electrode connecting means 18 per se can be readily manufactured with the consequent convenience. Likewise, the gate electrode connecting means 16 is passed through a through hole 24.

Figure 3:
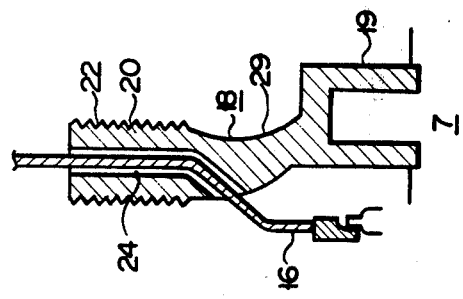
FIG. 3 is a cross-sectional view partly showing a semiconductor device according to another embodiment of this invention.

FIG. 3 shows another form of a cathode electrode connecting means. A curved intermediate section of the cathode electrode connecting means integrally extends from the cylindrical section 19 toward the cylindrical section 20 with its horizontal cross-section progressively increased to meet with the cylindrical section 20. This cathode electrode connecting means is effective in a case where the axis of the cylindrical section 19 of the cathode electrode connecting means 18 is greatly deviated from the axis of the stud 4. The gate electrode connecting means 16 is passed through the through hole 24 in the cathode electrode connecting means.

Figure 4:
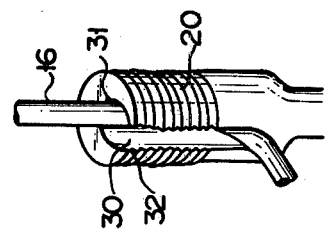
FIG. 4 is a perspective view partly showing a semiconductor device according to another embodiment of this invention.

The through hole 24 may be opened at its longitudinal side surface as shown in FIG. 4 to provide an open slot 30, but it is usually closed at its longitudinal side surface to provide a closed slot. The open slot 30 is deepened beyond the axis of the cylindrical section 20 to a location where a closed portion 31 is situated. This arrangement permits the gate electrode connecting means 16 to be easily placed in position.

As will be apparent from the foregoing, since in the semiconductor device according to this invention the anode electrode connector (stud) aligns with the free ends of the cathode electrode connecting means and gate electrode connecting mans, even if the stud is screw threaded to a suitable apparatus, the free ends of the cathode electrode connecting means and gate electrode connecting means remain in alignment with the stud, making it easy to mount them on suitable terminals. Furthermore, the gate electrode connecting means is received in the through hole of the rigid electrode connecting means, preventing the former from being limply located and impairing no outward appearance.

Although the above-mentioned embodiments are applied to the rectifying device, this invention is not restricted thereto. That is, this invention can be applied to, for example, a diode transistor, a semiconductor device including a semiconductor element having at least three semiconductor areas.

What is claimed is:

1. A semiconductor device comprising:
   a semiconductor element having at least three semiconductor areas corresponding to first, second and third semiconductor areas;
   a first electrode connecting means comprising a solid cylindrical electroconductive stud having a first end and a second end, said stud second end being electrically connected to said first semiconductor area;
   a housing comprising a hollow body having a closed end and an open end connected to said first electrode connecting means and surrounding said semiconductor element;
   a second electrode connecting means comprising a rigid electroconductive body extending outwardly of the housing, said rigid electroconductive body having a free end and a base end connected to the closed end of said housing in a position deviated from the axis of said first electrode connecting means, said rigid electroconductive body further comprising a section including said base end and a cylindrical section including said free end and situated concentrical with said first electrode connecting means, and a through hole extending from the side surface thereof toward said free end while passing at least through the center axis of said cylindrical section;
   a third electrode connecting means comprising a flexible electroconductive body extending outwardly of said housing and having a first free end and a second end connected to the closed end of said housing in a position deviated from the center axis of said first electrode connecting means, said flexible body electrically insulatingly passing through the through hole of said second electrode connection means, the free end of said third electrode connecting means extending from the free end of said second electrode connecting means;
   a first lead electrically connecting said second semiconductor area to said second electrode connecting means; and
   a second lead electrically connecting said third semiconductor area to said third electrode connecting means.

2. A semiconductor device according to claim 1 in which said second electrode connecting means integrally includes an intermediate solid cylindrical section disposed between said solid cylindrical section and said section including said base end and having a diameter substantially equal to that of said cylindrical section.

3. A semiconductor device according to claim 2 in which said section including said base end of said second electrode connecting means comprises a hollow cylindrical body.

4. A semiconductor device according to claim 3 in which said through hole constitutes a closed slot.

5. A semiconductor device according to claim 3 in which said through hole constitutes an open slot.

6. A semiconductor device according to claim 1 in which said second electrode connecting means integrally includes a curved section situated between said solid cylindrical section and said section including said base end and extending from said section including said base end toward said solid cylindrical section in a manner to progressively increase its diameter.

7. A semiconductor device according to claim 6 in which said section including said base end of said second electrode connecting means comprises a hollow cylindrical body.

8. A semiconductor device according to claim 7 in which said through hole constitutes a closed slot.

9. A semiconductor device according to claim 7 in which said through hole constitutes an open slot.

10. A semiconductor device according to claim 1 in which said second electrode connecting means includes at least one separate intermediate solid cylindrical section connected between said section including said base end and said solid cylindrical section and having a diameter larger than that of said solid cylindrical section.

11. A semiconductor device according to claim 10 in which said section including said base end of said second electrode connecting means comprises a hollow cylindrical section.

12. A semiconductor device according to claim 11 in which said through hole constitutes an open slot.

13. A semiconductor device according to claim 11 in which said through hole constitutes a closed slot.

14. A semiconductor device according to claim 13 in which said third electrode connecting means is coated with an electrically insulating material.

15. A semiconductor device according to claim 14 in which said hollow body of said housing is cylindrical and disposed concentrical with said first electrode connecting means.

16. A semiconductor device according to claim 14 in which said first electrode connecting means has an external thread.

17. A semiconductor device according to claim 15 in which said cylindrical section of said second electrode connecting means has an external thread at the free end portion thereof.

* * * * *